United States Patent
Taylor et al.

(10) Patent No.: US 8,900,489 B2
(45) Date of Patent: Dec. 2, 2014

(54) II-III-N SEMICONDUCTOR NANOPARTICLES AND METHOD OF MAKING SAME

(75) Inventors: Peter Neil Taylor, Oxford (GB); Jonathan Heffernan, Oxford (GB); Stewart Edward Hooper, Oxford (GB); Tim Michael Smeeton, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 336 days.

(21) Appl. No.: 13/188,713

(22) Filed: Jul. 22, 2011

(65) Prior Publication Data

US 2012/0025146 A1    Feb. 2, 2012

(30) Foreign Application Priority Data

Jul. 28, 2010 (GB) .................................. 1012644.9

(51) Int. Cl.
| | |
|---|---|
| *H01B 1/02* | (2006.01) |
| *C09K 11/62* | (2006.01) |
| *H01L 31/032* | (2006.01) |

(52) U.S. Cl.
CPC ............ *H01L 31/032* (2013.01); *C09K 11/623* (2013.01); *Y10S 977/773* (2013.01)
USPC ..... 252/519.51; 117/11; 117/84; 252/301.16; 252/301.6 R; 252/501.1; 257/13; 257/22; 257/103; 423/351; 423/561.1; 438/478; 977/773

(58) Field of Classification Search
USPC .................. 252/301.16, 301.4, 501.1, 519.51; 252/301.6; 117/11, 84; 423/351, 561.1; 438/478; 257/13, 22, 103; 428/403; 977/773, 896
See application file for complete search history.

(56) References Cited

U.S. PATENT DOCUMENTS

| | | |
|---|---|---|
| 3,660,178 A | 5/1972 | Takahashi et al. |
| 4,213,781 A | 7/1980 | Noreika et al. |

(Continued)

FOREIGN PATENT DOCUMENTS

| | | |
|---|---|---|
| GB | 2467161 | 7/2010 |
| JP | 01-239983 A | 9/1989 |

(Continued)

OTHER PUBLICATIONS

Co-pending U.S. Appl. No. 13/187,644, filed Jul. 21, 2011.

(Continued)

*Primary Examiner* — Khanh Tuan Nguyen
(74) *Attorney, Agent, or Firm* — Renner, Otto, Boisselle & Sklar, LLP

(57) ABSTRACT

The present application provides nitride semiconductor nanoparticles, for example nanocrystals, made from a new composition of matter in the form of a novel compound semiconductor family of the type group II-III-N, for example ZnGaN, ZnInN, ZnInGaN, ZnAlN, ZnAlGaN, ZnAlInN and ZnAlGaInN. This type of compound semiconductor nanocrystal is not previously known in the prior art. The invention also discloses II-N semiconductor nanocrystals, for example ZnN nanocrystals, which are a subgroup of the group II-III-N semiconductor nanocrystals. The composition and size of the new and novel II-III-N compound semiconductor nanocrystals can be controlled in order to tailor their band-gap and light emission properties. Efficient light emission in the ultraviolet-visible-infrared wavelength range is demonstrated. The products of this invention are useful as constituents of optoelectronic devices such as solar cells, light emitting diodes, laser diodes and as a light emitting phosphor material for LEDs and emissive EL displays.

12 Claims, 8 Drawing Sheets

(56) References Cited

U.S. PATENT DOCUMENTS

| | | | |
|---|---|---|---|
| 4,454,008 | A | 6/1984 | Pohlmann |
| 6,527,858 | B1 | 3/2003 | Yoshida et al. |
| 7,399,429 | B2 | 7/2008 | Liu et al. |
| 7,588,828 | B2 * | 9/2009 | Mushtaq et al. ............. 428/403 |
| 8,460,632 | B2 * | 6/2013 | Kang et al. ................. 423/561.1 |
| 2003/0167778 | A1 | 9/2003 | Bradley et al. |
| 2006/0001119 | A1 | 1/2006 | Liu et al. |
| 2006/0202167 | A1 * | 9/2006 | Landry et al. .......... 252/301.4 R |
| 2007/0075629 | A1 | 4/2007 | Le Toquin et al. |
| 2007/0090369 | A1 | 4/2007 | Kobayakawa |
| 2007/0104865 | A1 | 5/2007 | Pickett |
| 2008/0202383 | A1 | 8/2008 | Shi |
| 2008/0293244 | A1 | 11/2008 | Duan et al. |
| 2009/0121184 | A1 | 5/2009 | Fujii |
| 2010/0117070 | A1 | 5/2010 | Adekore et al. |

FOREIGN PATENT DOCUMENTS

| | | | |
|---|---|---|---|
| JP | 04-152579 A | | 5/1992 |
| JP | 06-077605 A | | 3/1994 |
| JP | 07-249821 A | | 9/1995 |
| JP | 2004-299918 | | 10/2004 |
| JP | 2005-159341 A | | 6/2005 |
| JP | 2008-071803 | * | 3/2008 ............. H01L 33/00 |

OTHER PUBLICATIONS

British Search Report for related British Application No. GB 1012646.4 dated Nov. 19, 2010.
Suski et al., "(GaMg)N new semiconductor grown at high pressure of nitrogen", Journal of Crystal Growth, vol. 207, (1999) pp. 27-29.
"Semiconductor Materials" (ISBN-08493-8912-7) http://goo.gl/1AUxV (1997).
Grabolle et al., "Determination of the Fluorescence Quantum Yield of Quantum Dots: Suitable Procedures and Achievable Uncertainties", Analytical Chemistry, vol. 81, No. 15, 2009, 6285-6294.
Sackett et al. "Nile Red As A Polarity-Sensitive Fluorescent Probe of Hydrophobic Protein Surfaces", Analytical Biochemistry, vol. 167, 1987, 228-234.
British Search Report for corresponding British Application No. GB 1012644.9 dated Nov. 19, 2010.
9691034 IEE Inspec, Dec. 5, 2005.
8418308 IEE Inspec, 2005.
Data Handbook by Madelung, Springer-Verlag press; $3^{rd}$ ed. edition; Nov. 2003.
Paniconi et al.; "Synthesis, stoichiometry and thermal stability of Zn3N2 powders prepared by ammonolysis reactions"; J. Solid State Chem 181 (2008) 158-165.
Chelluri et al.; "Molecular beam epitaxial growth of the II-V semiconductor compound Zn3AS2"; APL 49 24(1986) 1665-1667.
Buhro et al.; "Metallo-Organic Routes to Phosphide Semiconductors"; Polyhedron vol. 13 (1994) p. 1131.
Neumayer et al.; "Growth of Group III Nitrides. A Review of Precursors and Techniques"; Chem., Mater., 1996, 8, 25.
Gillan et al., "Low-temperature solvothermal synthesis of nanocrystalline indium nitride and Ga-In-N composites from the decomposition of metal azides"; J. Mater. Chem., 2006, 38, 3774.
Han et al., "Synthesis and optical properties of GaN/ZnO solid solution nanocrystals"; APL. 96, (2010) 183112.
Pankove et al., "Properties of Zn-doped GaN. I. Photoluminescence"; J. Appl. Phys. 45, 3, (1974) 1280-1286.
10930195 IEE Inspec, Oct. 1, 2009.
Zong Fujian et al., "Structural and Chemical Bond State of $Zn_3N_2$ Powder", Rare Metal Materials and Engineering, vol. 35, No. 1, pp. 55-58, Jan. 31, 2006.
Chinese Office Action for corresponding Chinese Application No. 201110211652.6 mailed May 28, 2013 and English translation.
Berger, Lev I., "Semiconductor Materials", pp. 1, 2, 5-7, 12, and 13, CRC Press, New York, 1997.
Fujian Zong et al., "Nano-structures and Properties of Zinc Nitride Prepared by Nitridation Technique", Materials Science Forum, 2005, vols. 475-479, p. 3787-3790.
Fujian Zong et al., "Structural properties and photoluminescence of zinc nitride nanowires", Applied Physics Letters, 2005, vol. 87, p. 233104-1~233104-3.

* cited by examiner (a)

(b)

II-III-N SEMICONDUCTOR NANOPARTICLES AND METHOD OF MAKING SAME

FIELD OF THE INVENTION

This invention relates to nitride semiconductor nanoparticles, for example nanocrystals having nanometer dimensions, and in particular to such materials in a new compound semiconductor system of the type group II-III-N. Such materials can be used in a wide range of applications including solar cells, light emitting diodes, emissive EL displays and bio-imaging.

BACKGROUND OF THE INVENTION

Semiconductor nanocrystals whose dimensions are comparable to the bulk exciton diameter show quantum confinement effects. This is seen most clearly in the optical spectra which shift to blue wavelengths as the size of the crystal is reduced.

A compound semiconductor is a semiconductor material composed of elements from two or more groups of the periodic table. These elements can form binary (2 elements), ternary (3 elements), quaternary (4 elements) or pentenary (5 elements) compounds. The most common families of compound semiconductors are III-V (e.g. GaAs, AlGaAs, GaN, GaInP) and II-VI (e.g. ZnS, CdTe, ZnO). But, numerous other compound semiconductor families have been studied (e.g. I-VII, IV-VI, V-VI, II-V etc). A comprehensive source of the basic data of known inorganic semiconductors is contained in Semiconductors: Data Handbook by Madelung, Springer-Verlag press; 3rd ed. edition (November 2003).

Semiconductor nanocrystals made from a wide range of materials have been studied including many II-VI and III-V semiconductors. II-V semiconductor compounds such as ZnN and ZnAs are known [Paniconi et al. J. Solid State Chem 181 (2008) 158-165] and [Chelluri et al. APL 49 24 (1986) 1665-1667] in the form of thin films or powders. For nanocrystals, [Buhro et al. Polyhedron Vol 13. (1994) p 1131] report on the synthesis of ZnP nanoparticles.

III-V semiconductors are numerous and one of the most interesting classes of III-V semiconductors is the III-nitrides, such as AlN, GaN, InN and their respective alloys. These are used for the manufacture of blue light-emitting diodes, laser diodes and power electronic devices. Nitrides are also chemically inert, are resistant to radiation, and have large breakdown fields, high thermal conductivities and large high-field electron drift mobilities, making them ideal for high-power applications in caustic environments [Neumayer at. al., Chem., Mater., 1996, 8, 25]. The band gaps of aluminum nitride (6.2 eV), gallium nitride (3.5 eV) and Indium nitride (0.7 eV) [Gillan et. al., J. Mater. Chem., 2006, 38, 3774] mean that nitrides span much of the ultraviolet, visible and infrared regions of the electromagnetic spectrum. The fact that alloys of these materials have direct optical band gaps over this range makes these very significant for optical devices.

Solid-solution GaN/ZnO nanocrystals have been reported [Han et al. APL. 96, (2010) 183112] and were formed by combining GaN and ZnO nanocrystals as a crystal solid. The ratio of ZnO to GaN was controlled by varying the nitridation time of a GaZnO precursor.

III-IV-V semiconductors, for example SiGaAs, have been reported in thin film form (for example in U.S. Pat. No. 4,213,781), but have not been reported not in nanoparticle form.

F. Zong et al. propose, in "Structural properties and photoluminescence of zinc nitride nanowires", Applied Physics Letters (8691034 IEE INSPEC, 2005) and in "Nano-structures and properties of zinc nitride prepared by nitridation technique", Proceedings of Fifth Pacific Rim International Conference on Advanced Materials and Processing", Beijing, 2004 (8418308 IEE INSPEC), the synthesis of zinc nitride nanowires by reacting zinc powder with ammonia gas. By a "nanowire" is meant a structure in which two dimensions are of the order of nanometers and the third dimension is much larger, typically of the order of micrometers.

US 2009/0121184 proposes a "hydrogen storage material", which can store hydrogen and release it when the material is heated. The material contains a mixture and a reaction product of a metal hydride and a metal amide.

US 2003/167778 proposes a nanostructure that contains hydrogen, for example for use in a hydrogen storage system. It lists magnesium nitride as a possible material, and suggests milling the material such that the resulting material "will contain some nanostructured storage material".

Y Ye et al. propose an amorphous zinc oxynitride semiconductor material, in "High mobility amorphous zinc oxynitride semiconductor material for thin film transistors", Applied Physics Letters (10930195 IET INSPEC, 2009).

U.S. Pat. No. 6,527,858 proposes the fabrication of a ZnO single crystal, by a process in which atomic zinc and oxygen are supplied to a growth chamber, together with atomic nitrogen (as a p-type dopant) and atomic gallium (as an n-type dopant).

SUMMARY OF THE INVENTION

A first aspect of the invention provides a semiconductor nanoparticle composed of a compound having the formula II-N or II-III-N, where II denotes one or more elements in Group II of the periodic table, and III denotes one or more elements in Group III of the periodic table By a "nanoparticle" is meant a particle having three dimensions that are nanoscale dimensions, for example of the order of 1 to 100 nm and more preferably of the order of 1 to 30 nm. A nanoparticle of the invention may have a crystalline or polycrystalline structure and so form a nanocrystal, or it may have an amorphous structure.

Where the semiconductor nanoparticle is composed of a compound having no more than one constituent element in either Group II or Group III, the semiconductor nanoparticle is composed of a compound having the general $II_x$-$III_y$-$N_z$, wherein x and z are greater than zero, y is equal to or greater than zero, and x, y and z give the relative quantities of the elements in the alloy and are set so as to balance the stoichiometry and electrical charge. More generally, a semiconductor nanoparticle of the invention is composed of a compound having a formula of the following general form: $IIa_{x1}$ $IIb_{x2}$ ... $IIIa_{y1}IIIb_{y2}$ ... $N_z$ where IIa, IIb ... correspond to different group II elements, IIIa, IIIb ... correspond to different group III elements, the numbers x1 and z are greater than zero, the numbers x2 ..., y1, y2 ... are greater than or equal to zero, and the numbers x1, x2 ... y1, y2 ... and z give the relative quantities of the elements in the alloy, and are set so as to balance the stoichiometry and electrical charge.

For convenience, the numbers x, y, z or x1, x2 ... y1, y2 ... and z will generally be omitted from formulae given herein.

The present invention provides a new composition of matter in the form of a compound semiconductor nanocrystals (or more generally nanoparticles) family of the type group II-III-N or II-N. Nanocrystals (or nanoparticles) made from the compound semiconductor of the II-III-N family or from a compound semiconductor of the II-N family are not known to have been made or studied previously.

US2007/0104865 lists many possible materials for nanocrystals including many possible II-V materials. ZnN nanocrystals are included in the list given in US2007/0104865, but the manufacture of ZnN nanocrystals is not demonstrated in US2007/0104865.

Doping of III-V semiconductors with a group II element (e.g. Mg) or IV element (e.g. Si) is typically used to change its electrical conductivity. However, the tiny amount of group II element typically needed to dope a III-V semiconductor does not lead to the formation of an II-III-V compound [see Pankove et al. J. Appl. Phys. 45, 3, (1974) 1280-1286]. As an example, U.S. Pat. No. 3,660,178 proposes diffusing elemental zinc into a III-V compound semiconductor, but the amount of diffused zinc is classified as an impurity. An impurity amount is significantly less than that needed to form a compound. The formation of a II-III-V compound is not disclosed or even proposed in U.S. Pat. No. 3,660,178.

In this connection it should be understood that in a nanoparticle of a II-III-V compound of the invention, the group II element(s), the group III element(s) and the group V element(s) are each incorporated into the crystal structure of the compound. That in, in a ZnInN or MgInN nanoparticle of the invention, for example, the Zn or Mg atoms, the In atoms and the N atoms are all arranged regularly in the ZnInN crystal structure. In contrast, in prior cases where a group II element such as Zn is used as a dopant in a III-V compound (as in U.S. Pat. No. 3,660,178), the group II element is present in very small amounts (compared to the amounts of group III element or group V element) and the group II element is not properly incorporated in to the crystal structure of the III-V compound—so that the result is a group III-V compound that contains a small amount of a group II impurity. As a general rule, a nanoparticle of a II-III-V compound of the present invention will contain at least 1% by volume of each of the group II, III and V element atoms—whereas, when a group II element is used as a dopant in a III-V compound, the compound will contain much less than 1% of the group II element.

Similarly, a nanoparticle of a II-N compound is defined as containing at least 1% by volume of each group II and N element atoms.

In the field of III-V semiconductor nanocrystals, the formation of nanocrystals of semiconductors with the formula ABC is proposed in U.S. Pat. No. 7,399,429, where A is group II, III or IV, B is group II, III or IV and C is group V or VI [paragraph 5]. However, the actual formation of nanocrystals of a compound having the specific formula II-III-N is not reported nor even specifically proposed.

US2008/0202383 discloses the formation of nanocrystals made from the I-II-III-VI semiconductor alloy. The formation of II-III-N or II-N nanocrystals is however not disclosed.

In the field of III-nitride semiconductor nanocrystals, UK patent application 0901225.3 describes emissive nitride nanocrystals in which zinc stearate is used as a capping agent during the synthesis of III-N nanocrystals. This application proposes that the zinc stearate molecules are coordinated onto the surface of the III-nitride nanocrystals and passivate the nitrogen atoms at or near the surface of the III-nitride nanocrystal, and does not show or state that a II-III-N nanocrystal or a II-N nanocrystal is formed.

The II-III-N compound semiconductor nanocrystals may comprise a material containing:
  one or more group II elements from the periodic table—for example, Zn, Cd, Hg, Be, Mg, Ca, Sr, Ba, Ra;
  one or more group III elements from the periodic table—for example, Ga, In, Al, B, Tl;
  and the element nitrogen This invention discloses group II-III-N semiconductor nanoparticles, for example nanoparticles of material families such as Zn-III-N or Mg-III-N, for example ZnGaN, ZnInN, ZnInGaN, ZnAlN, ZnAlGaN, MgInN, ZnAlInN and ZnAlGaInN nanoparticles. These type of compound semiconductor nanoparticles are not known in the prior art.

The II-III-V compound semiconductor nanoparticle may comprise a II-V subset containing:
  one or more group II elements from the periodic table—for example, Zn, Cd, Hg, Be, Mg, Ca, Sr, Ba, Ra;
  and the element nitrogen.

This invention also discloses a II-N semiconductor nanocrystals subgroup of the group II-III-N semiconductor nanocrystals, for example ZnN or MgN. These type of compound semiconductor nanocrystals are not known in the prior art.

A II-III-N or II-N nanoparticle of the invention has potentially many applications. The band gap energy or energy gap of a semiconductor is defined as the minimum room temperature energy gap between the valence band and conduction band of a semiconductor material. It is expected that the present invention will make possible the fabrication of nanoparticles of group II-III-N or II-N semiconductor compounds having an energy gap anywhere in the range from 0.6 eV to 6.2 eV, depending on both the composition of the II-III-N or II-N material (which affects the band gap energy of a bulk sample of the II-III-N or II-N material) and by the nanoparticle dimensions. The desired band gap energy will depend on the intended application of the group II-III-V semiconductor compound, but one important application of the invention is expected to be the fabrication of compounds having energy band gaps in the range 0.6 eV to 4.0 eV—this is the range required by a material to absorb almost the entire solar spectrum for use in very high efficiency solar cells.

The first II-N or II-III-N compound may be single crystal in structure, may be polycrystalline in structure or may be amorphous in structure.

The first II-N or II-III-N compound may form a core of the nanoparticle and the nanoparticle further may further comprises a layer disposed around the core and composed of a semiconductor material having a different composition to the first II-N or II-III-N compound. This provides a nanoparticle having a "core-shell" structure The shell may be composed of a second II-N or II-III-N compound, the second II-N or II-III-N compound having a different composition to the first II-N or II-III-N compound.

Alternatively, the invention may be used to provide a II-N or II-III-N shell of a core-shell nanoparticle structure where the core is composed of a material other than a II-N or III-N material.

In a core-shell nanoparticle structure, where the core or shell is formed of a II-N or II-III-N material in accordance with the invention it can in principle be formed of any II-N or II-III-N material. Preferably however the materials for the core and the shell are selected such that the shell has a band-gap that is larger than the band-gap of the core in order to confine electrical charge carriers within the core, as this is expected to enhance the PLQY of the nanoparticle. The shell also acts as protection layer around the core, preventing oxidation of the core.

The semiconductor nanoparticle may be light emissive. By a "light-emissive" material is meant a material that, when illuminated by a suitable exciting light source, emits light. One measure of whether a material is light-emissive is its "photoluminescence quantum yield" (PLQY)—the PLQY of a semiconductor material is the ratio, when the material is illuminated by an exciting light source to cause the material to photoluminesce, of the number of photons emitted by the material to the number of photons absorbed by the material. (It should be noted that the term "photoluminescence quantum yield" should not be confused with the term "photoluminescence quantum efficiency" which is sometimes used in the art. The "photoluminescence quantum efficiency" takes into account the energy of the photons which are absorbed and emitted by a material. In cases where the excitation and emission wavelengths are similar the photoluminescence quantum yield and photoluminescence quantum efficiency will have similar values; however in cases where the excitation wavelength is shorter and hence of higher energy than the emission wavelength the photoluminescence quantum efficiency will be lower than the photoluminescence quantum yield.)

For the purposes of this application, a "light-emissive" material will be defined as a material having a PLQY of 1% or greater.

A light-emissive nanoparticle of the invention may have a photoluminescence quantum yield of at least 5%, preferably of at least 20%, and more preferably of at least 50%.

The present group II-III-N semiconductor nanoparticles possess remarkable luminescent properties particularly in the visible region of the electromagnetic spectrum. Nanoparticles of such material readily exhibits PLQY values above 10%, and as high as 55% in the case of ZnAlN nanoparticles.

Nanoparticles of this invention are useful as a constituent of optoelectronic devices such as solar cells, light emitting diodes, laser diodes and as a light emitting phosphor material for LEDs and emissive EL displays.

A second aspect of the invention provides a method of making a semiconductor nanoparticle, the method comprising:
  reacting at least one source of a group II element, at least one source of a source of a group III element, and at least one source of nitrogen.

The semiconductor nanoparticle may be composed of a material having the formula II-III-N, where II denotes one or more elements in Group II of the periodic table and III denotes one or more elements in Group III of the periodic table.

The method may comprise reacting the at least one source of a group II element, the at least one source of a source of a group III element, and the at least one source of nitrogen element in a solvent.

The at least one source of a group II element may comprise a carboxylate of a group II element, and more particularly may comprise a stearate of a group II element (eg zinc stearate, in the case of formation of a nanocrystal having zinc as its group II element, as or one of its group II elements).

It has been found that the use of a carboxylate, for example a stearate, as a starting material to provide a group II element of the II-III-N compound is effective in obtaining a light-emissive II-III-N material, in particular obtaining light-emissive II-III-N nanoparticle.

The nanoparticles increase in size as the reaction progresses so it is possible to vary the dimensions of the obtained nanoparticles by varying the time at which the nanoparticles are extracted from the reaction mixture. Since properties of the nanoparticles such as peak emission wavelength depend on the nanoparticle dimensions, this enables nanoparticles having desired properties, for example desired emissive or absorption properties, to be obtained.

Since the nanoparticles increase in size as the reaction progresses, it is possible to obtain a monodisperse, or substantially monodisperse, population of nanoparticles by extracting all nanoparticles in the population from the reaction mixture at the same time. (As is known, a collection of particles are referred to as "monodisperse", or "monosized", if they have the same size and shape as one another.)

A third aspect of the invention provides a method of making a semiconductor nanoparticle, the method comprising:
  reacting at least one source of a group II element and at least one source of nitrogen.

The semiconductor nanoparticle may be composed of a material having the formula II-N, where II denotes one or more elements in Group II of the periodic table.

The method may comprise reacting the at least one source of a group II element and the at least one source of nitrogen in a solvent.

The at least one source of a group II element may comprise a carboxylate of a group II element, and more particularly may comprise a stearate of a group II element (eg zinc stearate, in the formation of a II-III-N nanocrystal having zinc as its group II element, as or one of its group II elements.

In both the second and third aspects the at least one source of nitrogen may comprise an amide, for example sodium amide. The use of a carboxylate as a source of a group II element (for example use of zinc stearate in an example where zinc is the/a Group II material) together with the use of an amide as the source of a group V element has been found to be particularly advantageous in the formation of nanocrystals of a II-III-V compound, as the carboxylate is believed to help to solubilise the sodium amide in the reaction mixture to provide a more homogeneous solution, which is expected to allow for more controlled growth of the nanocrystals.

The invention is not however limited to use of a carboxylate as the source of the group II element and other sources of the group II element may be used, such as, for example, amines, acetoacetonates, sulfonates, phosphonates, thiocarbamates or thiolates.

The II-III-N or II-N material may form the core of a core-shell nanoparticle, and the method may further comprise forming a layer of another semiconductor material over the core to form the shell. The another semiconductor material may be another II-III-N or II-N material, or alternatively the another semiconductor material may be a material that is not a II-III-N or II-N material.

Alternatively the II-III-N or II-N material may form the shell of a core-shell nanoparticle, in which case the method comprises forming the II-III-N or II-N material over a core so that the II-III-N or II-N material forms a shell. The core may be formed of another II-III-N or II-N material, or alternatively the core may be formed of a semiconductor material that is not a II-III-N or II-N material.

BRIEF DESCRIPTION OF THE DRAWINGS

Preferred embodiments of the present invention will be described by way of example with reference to the accompanying figures, in which.

DESCRIPTION OF THE PREFERRED EMBODIMENTS

Figure 1:
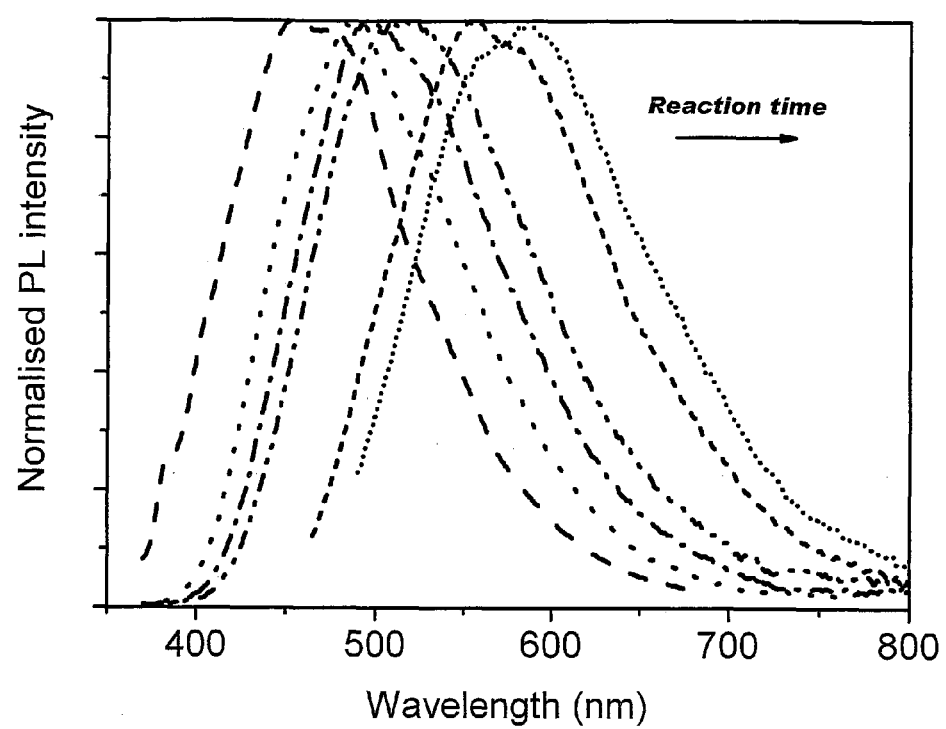
FIG. 1: shows PL emission spectra of a set of zinc gallium nitride nanocrystal solutions obtained from a single reaction at different times.

This invention relates to nanoparticles, for example nanocrystals, of semiconducting compounds. More specifically it relates to nanoparticles, for example nanocrystals, of group II-III-N compound semiconductors of the general formulae II-III-N or II-N where II is an element, or elements, from group II of the periodic table, III is an element, or elements from group III of the periodic table and N is nitrogen.

The present invention makes possible the fabrication of nanoparticles, for example nanocrystals. The nanocrystals may be fabricated such that their diameters range from about 1 nm to about 100 nm and more specifically from about 1 nm to about 30 nm. The invention may be used to fabricate nanocrystals of a range of shapes such as roughly spherical or teardrop-shapes. In addition the nanocrystals provided by this invention may have a core-shell structure where a shell of a second material is grown directly onto the surface of the nanocrystal (which forms the core of the core-shell structure). More than one such shell may be grown. This shell may be made the same material or from a different material to that used for the core or an alternative III-V or II-VI semiconductor or any other suitable material. Ideally the band gap of the shell material will be larger that that of the material which forms the core to help confine the excited state within the core of the nanocrystals; this is known to improve the intensity of the emission from such materials.

In a preferred embodiment, the present II-III-N semiconductor nanoparticles may exist in the form of crystalline nanoparticles.

In another preferred embodiment, the present II-III-N semiconductor nanoparticles may exist in the form of polycrystalline nanoparticles.

In another preferred embodiment, the present II-III-N semiconductor nanoparticles may exist in the form of amorphous nanoparticles.

In another preferred embodiment, the II-III-N nanoparticles may be light emissive and have a photoluminescence quantum yield of at least 5%, or of at least 20%, or of at least 50%.

In another preferred embodiment, the present II-III-N semiconductor nanocrystals consist of zinc gallium nitride. This material alloy has an energy gap of between 1.0 eV and 3.4 eV, depending on the Zn:Ga ratio, which traverses the visible spectral region.

In another preferred embodiment, the present II-III-N semiconductor nanocrystals consist of zinc aluminum gallium indium nitride. This material has an energy gap of between 0.6 eV and 4.0 eV, again depending on the exact composition, that traverses the solar spectral region.

In another preferred embodiment, the present II-III-N semiconductor nanocrystals consist of zinc aluminum nitride. This material alloy can yield a wide energy gap up to 6.2 eV for emission of ultraviolet light In another preferred embodiment, the present II-III-V semiconductor nanocrystals consist of zinc indium nitride. This material alloy can yield a small energy gap of 0.6 eV for emission of infrared light.

In another preferred embodiment the II-III-N semiconductor nanocrystals can be doped with one or more impurity elements. Examples of impurity elements are silicon, magnesium, carbon, beryllium, calcium, germanium, tin and lead.

An application of the novel material of the current invention is the use of II-III-N compound semiconductor nanocrystals to provide a phosphor which is excited by a light source such as a light emitting diode or laser diode.

An application of the novel material of the current invention is the use of II-III-N compound semiconductor nanocrystals to provide large area illumination panels which are excited by a light source such as a light emitting diode or laser diode.

A further application of the novel material of the current invention is the use of II-III-N compound semiconductor nanocrystals in a solar cell.

A further application of the novel material of the current invention is the use of II-III-N compound semiconductor nanocrystals in a photovoltaic device.

A further application of the novel material of the current invention is the use of II-III-N compound semiconductor nanocrystals in a light emitting diode.

A further application of the novel material of the current invention is the use of II-III-N compound semiconductor nanocrystals in a light emitting device.

A further application of the novel material of the current invention is the use of II-III-N compound semiconductor nanocrystals in a laser diode device.

A further application of the novel material of the current invention is the use of II-III-N compound semiconductor nanocrystals in a laser A further application of the novel material of the current invention is the use of II-III-N compound semiconductor nanocrystals in an electronic device.

A further application of the novel material of the current invention is the use of II-III-N compound semiconductor nanocrystals in a transistor device.

A further application of the novel material of the current invention is the use of II-III-N compound semiconductor nanocrystals in a microprocessor device.

A further application of the novel material of the current invention is the use of II-III-N compound semiconductor nanocrystals in an amplifier device.

A further application of the novel material of the current invention is the use of II-III-N compound semiconductor nanocrystals in a power switching device.

A further application of the novel material of the current invention is the use of II-III-N compound semiconductor nanocrystals in a power regulator device.

A further application of the novel material of the current invention is the use of II-III-N compound semiconductor nanocrystals in a light detecting device.

A further application of the novel material of the current invention is the use of an II-III-N compound semiconductor nanocrystals to provide fluorescent fibres, rods, wires and other shapes.

A further application of the novel material of the current invention is the use of an electrical current to generate the excited state which decays with the emission of light to make a light emitting diode with direct electrical injection into the II-III-N semiconductor nanocrystals.

A further application of the novel material of the current invention is the use of II-III-N compound semiconductor nanocrystals as part of the back light used in a liquid crystal display.

A further application of the novel material of the current invention is the use of II-III-N compound semiconductor nanocrystals as the emissive species in a display such as a plasma display panel, a field emission display or a cathode ray tube.

A further application of the novel material of the current invention is the use of II-III-N compound semiconductor nanocrystals as the emissive species in an organic light emitting diode.

A further application of the novel material of the current invention is the use of II-III-N compound semiconductor nanocrystals as the emissive species in a solar concentrator, where the light emitted by the solar concentrator is matched to a solar cell used to convert the collected light to an electrical current. More than one such concentrator may be stacked on one another to provide light at a series of wavelengths each matched to a separate solar cell.

A further application of the novel material of the current invention is the use of II-III-N compound semiconductor nanocrystals as the light harvesting species in an organic solar cell or photo detector.

A further application of the novel material of the current invention is the use of II-III-N compound semiconductor nanocrystals as the light harvesting species in a dye sensitised solar cell or photo detector.

A further application of the novel material of the current invention is the use of II-III-N compound semiconductor nanocrystals to generate multiple excitons from the absorption of a single photon though the process of multiple exciton generation in a solar cell or photo detector.

A further application of the novel material of the current invention is the use of II-III-N compound semiconductor nanocrystals to assist identification in combat.

A further application of the novel material of the current invention is the use of II-III-N compound semiconductor nanocrystals to assist in asset tracking and marking.

A further application of nanocrystals of this invention is the use of II-III-N compound semiconductor nanocrystals as counterfeit inks.

A further application of the novel material of the current invention is the use of II-III-N compound semiconductor nanocrystals as bio markers both in-vivo and in-vitro.

A further application of the novel material of the current invention is the use of II-III-N compound semiconductor nanocrystals in photodynamic therapy.

A further application of the novel material of the current invention is the use of II-III-N compound semiconductor nanocrystals as bio markers in for example cancer diagnosis, flow cytometry and immunoassays.

A further application of the novel material of the current invention is the use of II-III-N compound semiconductor nanocrystals in flash memory.

A further application of the novel material of the current invention is the use of II-III-N compound semiconductor nanocrystals in quantum computing.

A further application of the novel material of the current invention is the use of II-III-N compound semiconductor nanocrystals in dynamic holography.

A further application of the novel material of the current invention is the use of II-III-N compound semiconductor nanocrystals in a thermoelectric device.

A further application of the novel material of this invention is the use of II-III-N compound semiconductor nanocrystals in a device used in telecommunications.

A further application of the novel material of this invention is the use of II-III-N compound semiconductor nanocrystals for any application.

EXAMPLES

In the following examples, several methods of fabricating a form of the present invention are described. Other methods of forming II-III-N semiconductor nanoparticles are, but not exclusively: metal organic vapour phase epitaxy (MOVPE), molecular beam epitaxy (MBE), chemical vapour deposition (CVD), sputtering, plasma assisted vacuum deposition, pulsed laser deposition (PLD), Hydride vapour phase epitaxy (HVPE), sublimation, thermal decomposition and condensation, annealing, powder or metal nitridation.

Photoluminescence quantum yield (PLQY) measurements are carried out using the procedure described in *Analytical Chemistry*, Vol. 81, No. 15, 2009, 6285-6294. Dilute samples of the nitride nanocrystals in cyclohexane with absorbance between 0.04 and 0.1 are used. Nile red PLQY 70% (*Analytical Biochemistry*, Vol. 167, 1987, 228-234) in 1,4-dioxane was used as a standard.

It should understood that the examples are given by way of illustration only, and that the invention is not limited to the examples. For example, although Examples 1 to 8 use a carboxylate, in particular a stearate, as the source of the group II element the invention is not limited to this and other precursors of the group II element may be used, such as, for example, amines, acetoacetonates, sulfonates, phosphonates, thiocarbamates or thiolates. Moreover, although Examples 1 to 8 use 1-octadecene or dipheyl ether as a solvent the invention is not limited to these particular solvents.

The methods described below have been found effective to obtain nanoparticles having three dimensions of the order of 1 to 100 nm, or having three dimensions of the order of 1 to 30 nm. The size of the obtained nanoparticles may be determined in any suitable way such as, for example, taking a Transmission Electron Micrograph (TEM) image of the nanoparticles and estimating the size of the nanoparticles from the TEM image.

Example 1

Colloidal ZnGaN Semiconductor Nanocrystals

Gallium iodide (270 mg, 0.6 mmol), sodium amide (500 mg, 12.8 mmol), hexadecane thiol (308 µl, 1.0 mmol), zinc stearate (379 mg, 0.6 mmol) and 1-octadecene (20 ml) were heated rapidly to 250° C. and maintained at that temperature. Of the reaction constituents, Gallium iodide provided a Group III metal (Gallium), sodium amide provided the Nitrogen atoms, hexadecane thiol is a capping agent with an electron-donating group, zinc stearate provided a Group II metal (Zinc) and 1-octadecene acts as a solvent. Over the course of 60 minutes a number of 0.25 ml portions of the reaction mixture were removed and diluted with toluene (3 ml) and any insoluble materials were removed using a centrifuge. The resulting clear solutions were analysed by emission spectroscopy and showed a change in the peak emission wavelength from 450-600 nm over the course of the reaction, as shown in FIG. 1. The peak in the emission spectrum has a full width at half the maximum intensity of the order of 100 nm.

The resultant ZnGaN nanoparticles were found to have a Ga:Zn ratio of approximately 1:1.3.

When samples from such a reaction are illuminated with a UV light sources, the resultant emission is easily visible with the naked eye for samples emitting in the visible region. This illustrates the high quantum yield of ZnGaN nanostructures obtainable by the present invention.

The corresponding emission spectra of these samples are shown in FIG. 1. The lefthand-most emission spectrum (shown as a dashed line) was obtained for a sample of the reaction mixture removed a few minutes after the start of the reaction, in this example 10 minutes after the start of the reaction. The righthand-most emission spectrum (shown as a dotted line) was obtained for a sample of the reaction mixture removed approximately one hour after the start of the reaction. The emission spectra between the lefthand-most emission spectrum and the righthand-most emission spectrum were obtained for samples of the reaction mixture removed at intermediate times.

It should be noted that the peak wavelength of the emission spectrum does not change uniformly with time. Initially the peak emission wavelength increases rapidly with time, but as the reaction proceeds the rate of increase, with time, of the peak emission wavelength falls.

As can be seen from FIG. 1, the emission spectra of samples removed at times up to about one hour after the start of the reaction span much of the visible region from blue to orange-red. Thus, nanocrystals having particular optical properties (such as a desired peak emission wavelength) can be obtained by appropriate choice of the reaction period before the nanocrystals are recovered from the solution.

The photoluminescence quantum yield of a sample removed from this reaction was measured and gave a value of greater than 30%.

Figure 2:
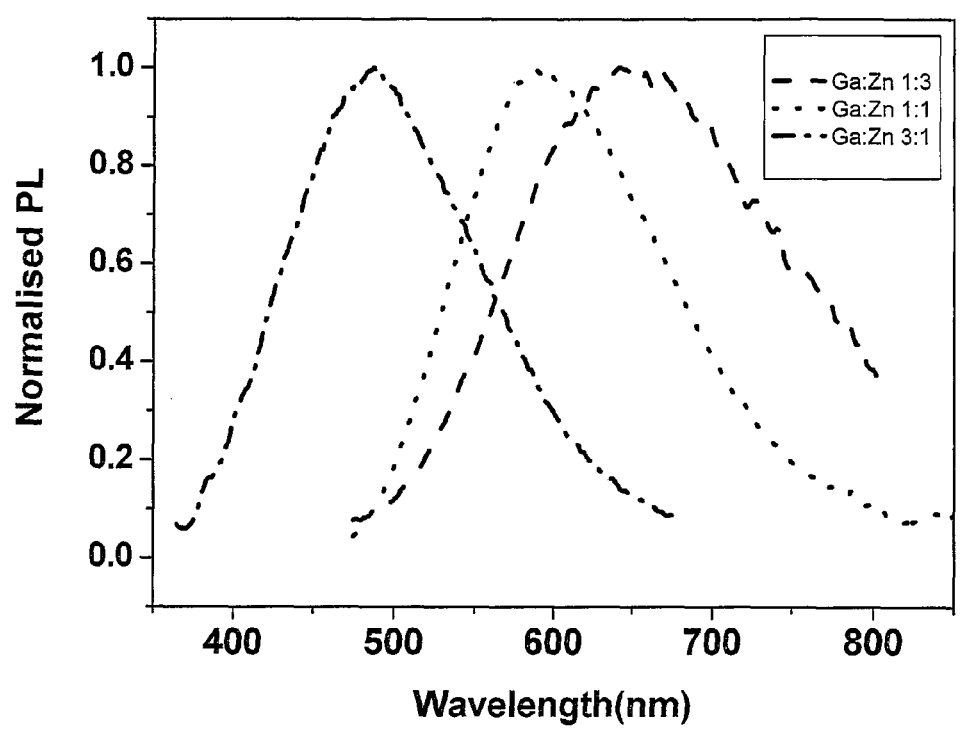
FIG. 2: shows the room temperature PL emission spectra of ZnGaN nanocrystal solutions containing having gallium:zinc molar ratios of 1:3, 1:1 and 3:1.

Using the same synthesis procedure, several other ZnGaN nanocrystal compounds were formed. For example:

The ratio of gallium iodide to zinc stearate was varied in order to produce compounds of zinc gallium nitride containing different amounts of gallium and zinc. FIG. 2 shows the PL spectra from samples made with different zinc to gallium ratios. The emission spectra for nanoparticles with a Ga:Zn ratio of 3:1 was obtained for a sample of the reaction mixture removed approximately 90 minutes after the start of the reaction, and the emission spectrum for nanoparticles with a Ga:Zn ratio of 1:1 was also obtained for a sample of the reaction mixture removed approximately 90 minutes after the start of the reaction. The emission spectra for nanoparticles with a Ga:Zn ratio of 1:3 was obtained for a sample of the reaction mixture removed approximately 20 minutes after the start of the reaction. Thus, the emission spectra of samples removed at times up to about 90 minutes were found to span the ultraviolet-visible-infrared regions.

Figure 3:
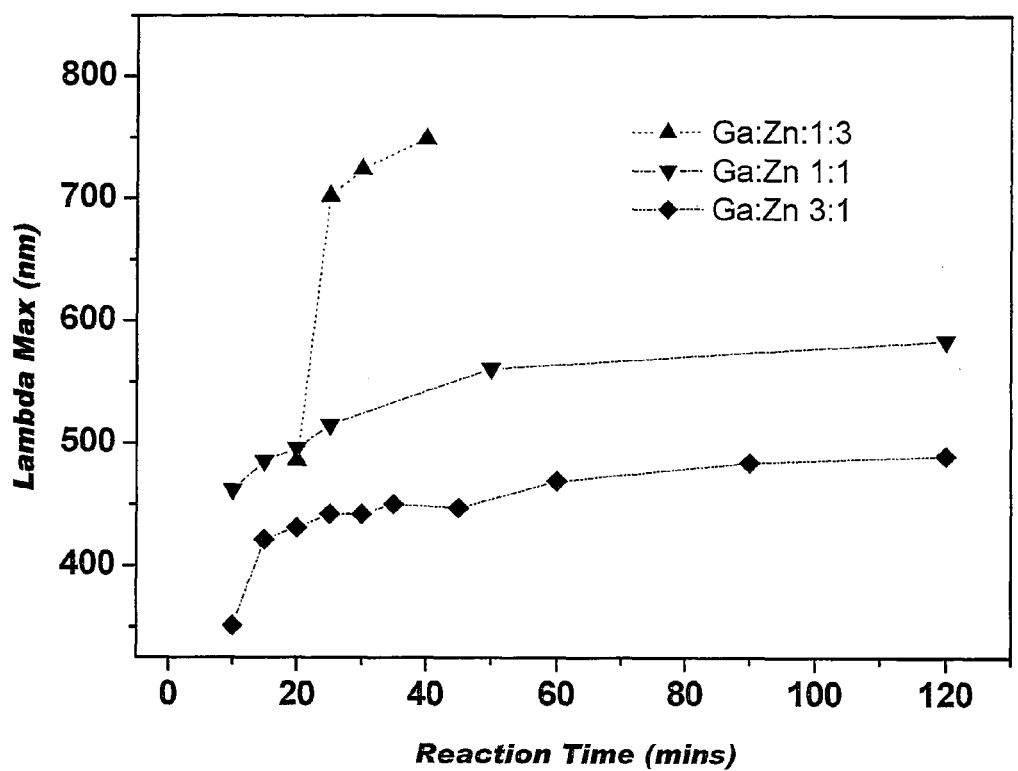
FIG. 3 shows the variation in the peak PL emission wavelengths of ZnGaN nanocrystal solutions obtained for different reaction times and using different zinc to gallium ratios.

FIG. 3 shows the variation in the peak PL emission wavelengths of ZnGaN nanocrystals obtained for different reaction times and using three different zinc to gallium ratios. This result demonstrates that nanocrystals having particular optical properties (such as a desired peak emission wavelength) can be obtained by appropriate choice of the reaction period before the nanocrystals are recovered from the solution, and from the appropriate choice of quantities of zinc and gallium in the synthesis reaction. Thus, as an example, a person wishing to fabricate nanoparticles having a peak emission wavelength of approximately 450 nm (in the blue region of the spectrum) may see from FIG. 3 that this made be done by fabricating ZnGaN nanoparticles as described in Example 1, by choosing the quantities of the constituents such that the nanoparticles have a Ga:Zn ratio of 3:1, and removing the sample from the reaction about 35 minutes after the start of the reaction.

For a nanocrystal sample made with a Ga:Zn ratio of 4:1 in the reaction constituents a photoluminescence quantum yield value of 45% was obtained using a reaction time of 40 minutes.

It can therefore be seen that the present invention makes possible the formation of zinc gallium nitride nanocrystals, or more generally, nanocrystals of the Group II-III-N compound semiconductor family, which have extremely good light-emissive properties.

Example 2

Colloidal ZnInN Semiconductor Nanocrystals

Figure 4:
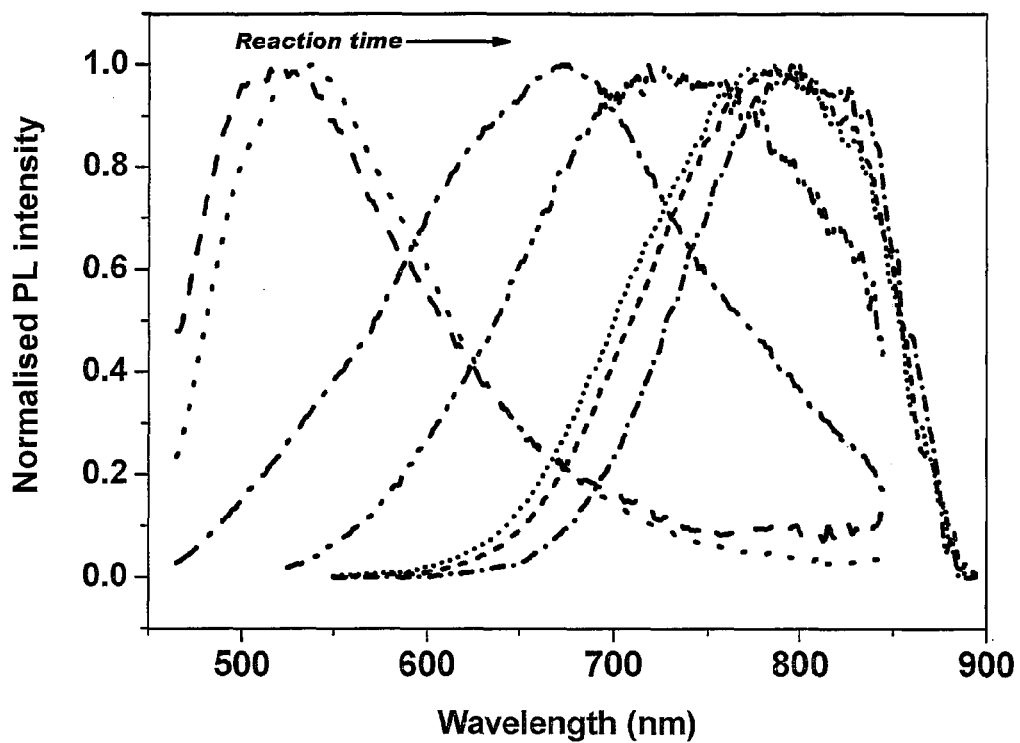
FIG. 4: shows the room temperature PL emission spectra of ZnInN nanocrystal solutions obtained from a single reaction at different times.

Indium iodide (300 mg, 0.6 mmol), sodium amide (500 mg, 12.8 mmol), hexadecane thiol (308 µl, 1.0 mmol), zinc stearate (379 mg, 0.6 mmol) and diphenyl ether (20 ml) were heated rapidly to 250° C. and maintained at that temperature. Of the reaction constituents, Indium iodide provided a Group III metal (indium), sodium amide provided the Nitrogen, hexadecane thiol is a capping agent with an electron-donating group, zinc stearate provided a Group II metal (Zinc) and diphenyl ether acts as a solvent. Over the course of 60 minutes a number of 0.25 ml portions of the reaction mixture were removed and diluted with cyclohexane (3 ml) and any insoluble materials were removed using a centrifuge. The resulting clear solutions were analysed by PL emission spectroscopy and showed a change in the maximum emission wavelength from 500-850 nm over the course of the reaction, as shown in FIG. 4. (The lefthand-most emission spectrum in FIG. 4 was obtained for a sample of the reaction mixture removed approximately 5 minutes after the reaction started, and the other emission spectra were obtained for samples of the reaction mixture removed approximately 10 minutes, 15 minutes, 20 minutes, 25 minutes, 35 minutes and 60 minutes after the reaction started.) The peak in the emission spectrum has a full width at half the maximum intensity of the order of 100 nm.

When samples from such a reaction are illuminated with a UV light sources, the resultant emission is easily visible with the naked eye for samples emitting in the visible region. This illustrates the high photoluminescence quantum yield of ZnInN nanostructures obtainable by the present invention.

The corresponding PL emission spectra of these samples are shown in FIG. 4. The emission spectra of samples removed at times up to about one hour span substantially the whole visible region and extend into the infra-red. Thus, nanocrystals having particular optical properties (such as a desired peak emission wavelength) can be obtained by appropriate choice of the reaction period before the nanocrystals are recovered from the solution.

The photoluminescence quantum yield of a sample removed from this reaction was measured and gave a value of 10%.

Figure 5:
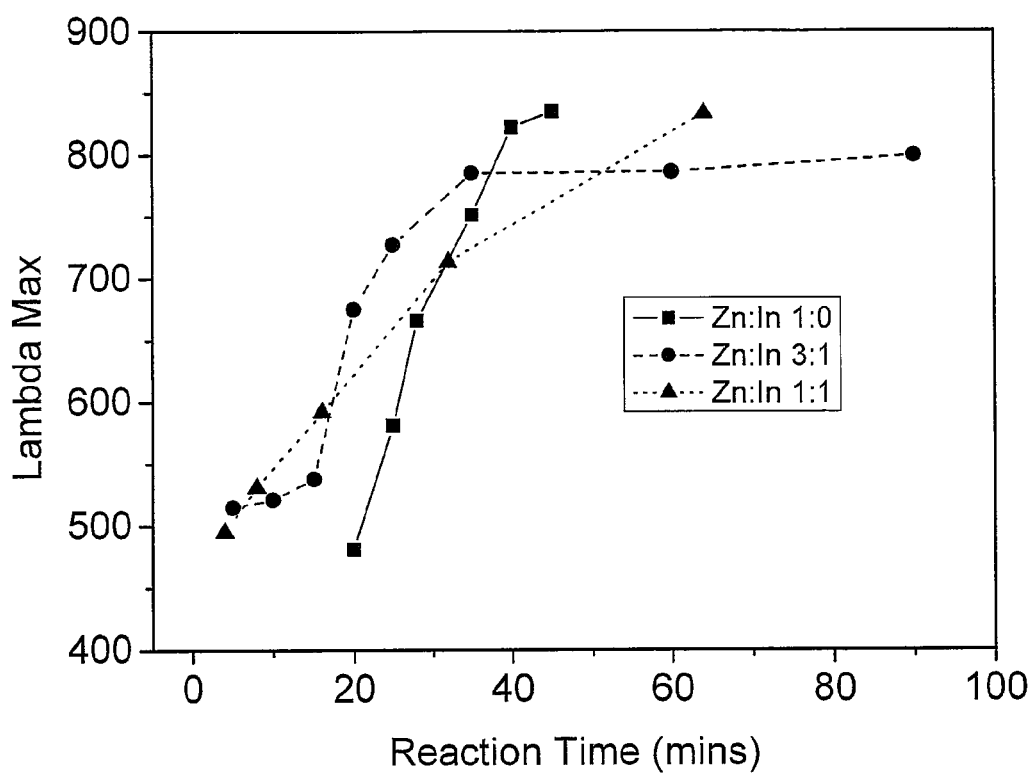
FIG. 5 shows the variation in the peak PL emission wavelengths of ZnInN nanocrystal solutions obtained for different reaction times and using different zinc to indium ratios.

Using the same synthesis procedure, several other ZnInN nanocrystal compounds were formed. For example:

The ratio of indium iodide to zinc stearate was varied in order to produce compounds of zinc indium nitride containing different amounts of indium and zinc. FIG. 5 shows the variation in the peak PL emission wavelengths of ZnInN nanocrystals obtained for different reaction times and using different zinc to indium ratios. This result demonstrates that nanocrystals having particular optical properties (such as a desired peak emission wavelength) can be obtained by appropriate choice of the reaction period before the nanocrystals are recovered from the solution, and from the appropriate choice of quantities of zinc and indium in the synthesis reaction.

For a nanocrystal sample made with a In:Zn ratio of 1:4 a photoluminescence quantum yield value of 30% was obtained using a reaction time of 20 minutes.

It can therefore be seen that the present invention makes possible the formation of zinc indium nitride nanocrystals, or more generally, nanocrystals of the Group II-III-N compound semiconductor family, which have extremely good light-emissive properties.

Example 3

Colloidal ZnAlN Semiconductor Nanocrystals

Aluminum iodide (102 mg, 0.25 mmol), sodium amide (468 mg, 12 mmol), hexadecane thiol (259 µl, 1.0 mmol), zinc stearate (474 mg, 0.75 mmol) and 1-octadecene (25 ml) were heated rapidly to 250° C. and maintained at that temperature. Of the reaction constituents, Aluminum iodide provided a Group III metal (Aluminum), sodium amide provided the Nitrogen atoms, hexadecane thiol is a capping agent with an electron-donating group, zinc stearate provided a Group II metal (Zinc) and 1-octadecene acts as a solvent. Over the course of 60 minutes a number of 0.25 ml portions of the reaction mixture were removed and diluted with toluene (3 ml) and any insoluble materials were removed using a centrifuge. The resulting clear solutions were analysed by absorption and emission spectroscopy and showed a change in the maximum emission wavelength from 420-950 nm over the course of the reaction, as shown in FIG. 5. The peak in the emission spectrum has a full width at half the maximum intensity of the order of 100 nm.

When samples from such a reaction are illuminated with a UV light sources, the resultant emission is easily visible with the naked eye for samples emitting in the visible region. This illustrates the high quantum yield of ZnAlN nanostructures obtainable by the present invention.

Figure 6:
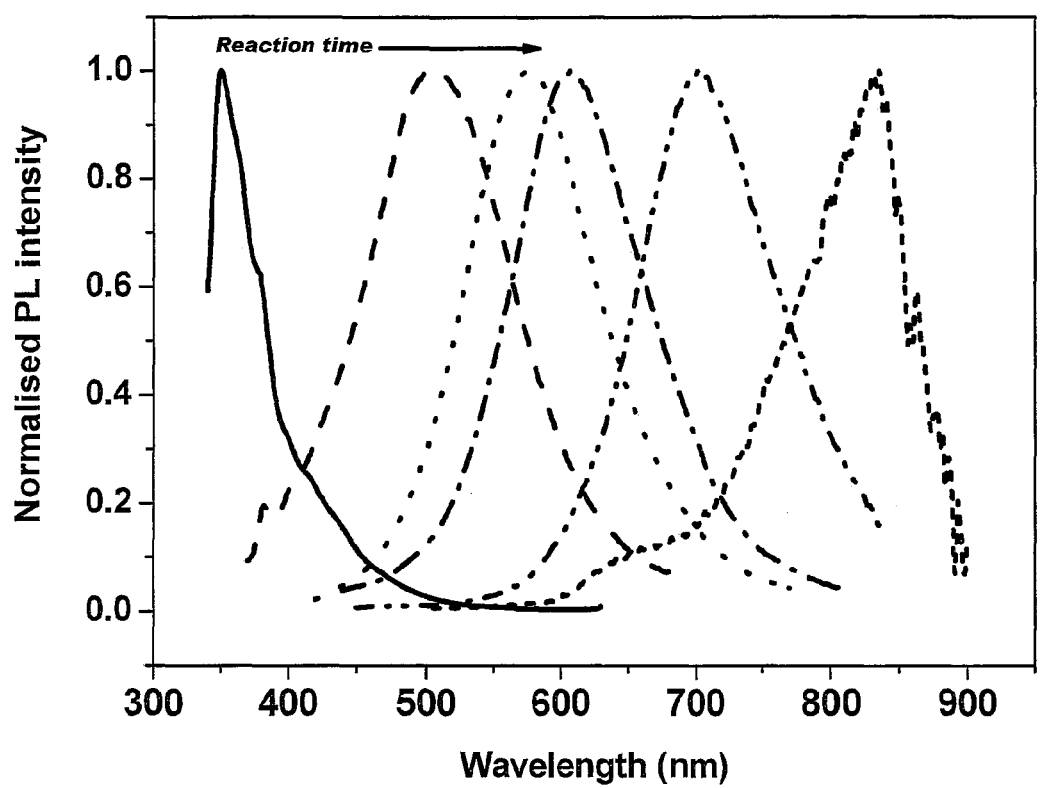
FIG. 6: shows the room temperature PL emission spectra of ZnAlN nanocrystal solutions obtained from a single reaction at different times.

The corresponding emission spectra of these samples are shown in FIG. 6. The lefthand-most emission spectrum in FIG. 6 was obtained for a sample of the reaction mixture removed a few minutes after the start of the reaction, and the righthand-most emission spectrum was obtained for a sample of the reaction mixture removed approximately 60 minutes after the start of the reaction. The emission spectra between the lefthand-most emission spectrum and the righthand-most emission spectrum were obtained for samples of the reaction mixture removed at intermediate times.) The emission spectra of samples removed at times up to about one hour span the ultraviolet to visible region and extend into the infra-red. Thus, nanocrystals having particular optical properties (such as a desired peak emission wavelength) can be obtained by appropriate choice of the reaction period before the nanocrystals are recovered from the solution.

The photoluminescence quantum yield of a sample removed from this reaction was measured and gave a value of greater than 55%.

Figure 8:
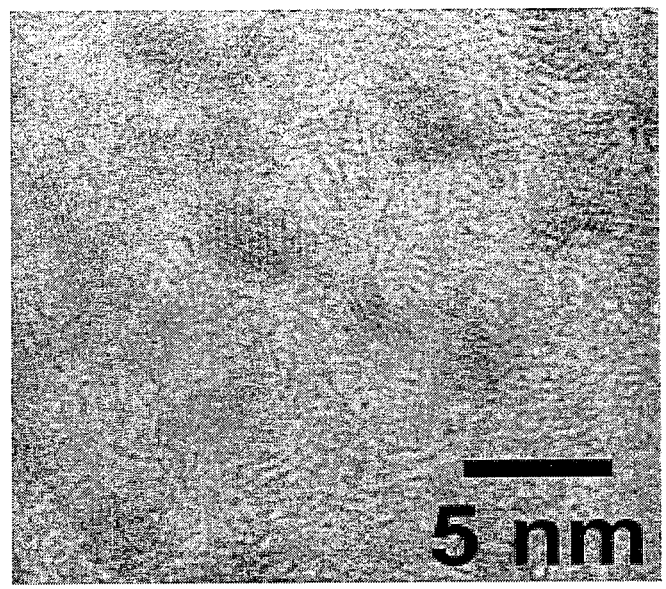
FIGS. 8(a) and 8(b) are Transmission Electron Micrographs of ZnAlN nanoparticles obtained by a method of the invention.
Figure 8:
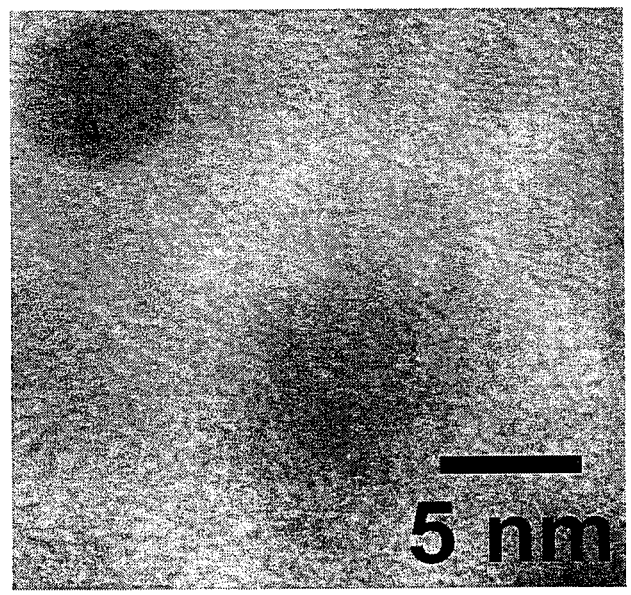

FIG. 8(a) is a Transmission Electron Micrograph of ZnAlN nanoparticles obtained by a method as described in this example. The nanoparticles have a dimension of approximately 3 nm. The image of FIG. 8(a) was obtained for a sample of the reaction mixture removed approximately 12 minutes after the start of the reaction.

FIG. 8(b) is a second Transmission Electron Micrograph of ZnAlN nanoparticles obtained by a method as described in this example. The image of FIG. 8(b) was obtained for a sample of the reaction mixture removed approximately 60 minutes after the start of the reaction. It can be seen that the nanoparticles of FIG. 8(b) have a dimension of approximately 5 nm, compared to the dimension of approximately 3 nm for the nanoparticles of FIG. 8(a).

Methods as described herein may be used to fabricate nanoparticles having dimensions of more than 5 nm, by using longer reaction times. It should however be noted that many of the applications envisaged for nanoparticles of the invention require nanoparticles that emit light in the visible region of the spectrum and, in general, this requires that the nanoparticles have dimensions of 5 nm or below—nanoparticles having dimensions of more than 5 nm will, in most cases, have a peak emission wavelength of 750 nm or greater.

Also, fabricating nanoparticles having dimensions of more than 5 nm would require the use of larger quantities of source chemicals as well as requiring longer reaction times.

It can therefore be seen that the present invention makes possible the formation of zinc aluminum nitride nanocrystals, or more generally, nanocrystals of the Group II-III-V compound semiconductor family, which have extremely good light-emissive properties.

Example 4

Colloidal MgInN Semiconductor Nanocrystals

MgInN nanocrystals were fabricated by a method similar to that described in example 2, except that magnesium stearate was used as a starting material instead of zinc stearate.

Example 5

Colloidal ZnN Semiconductor Nanocrystals

Figure 7:
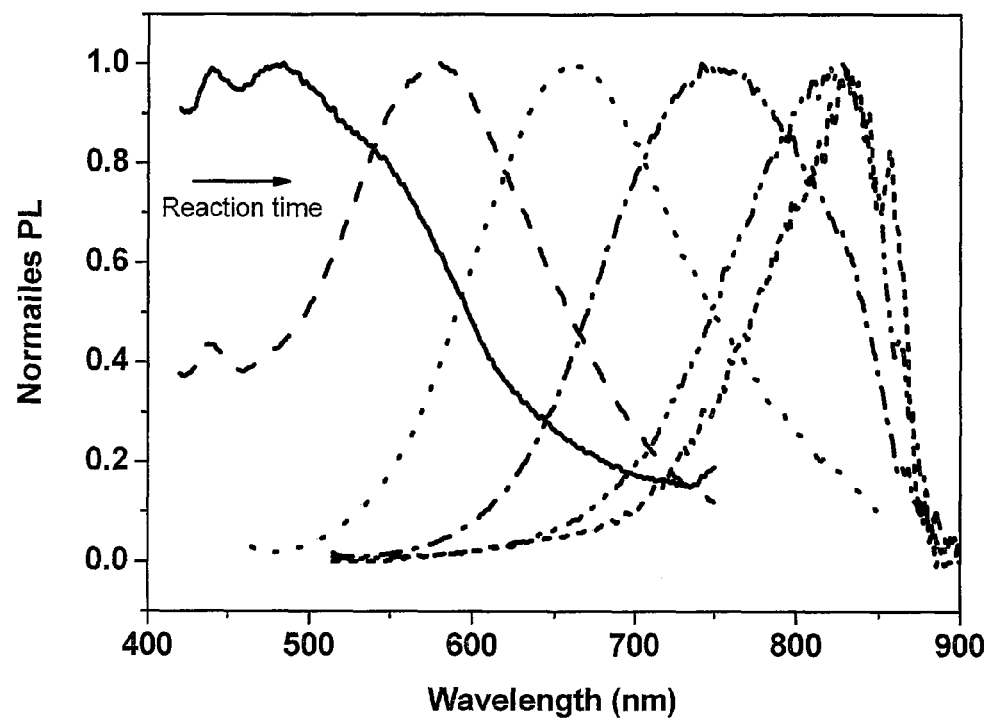
FIG. 7: shows the room temperature PL emission spectra of zinc nitride nanocrystal solutions obtained from a single reaction at different times.

Sodium amide (500 mg, 12.8 mmol), zinc stearate (379 mg, 0.6 mmol) and 1-octadecene (20 ml) were heated rapidly to 250° C. and maintained at that temperature. Of the reaction constituents, sodium amide provided the Nitrogen atoms, zinc stearate provided a Group II metal (Zinc) and 1-octadecene acts as a solvent. Over the course of 60 minutes a number of 0.25 ml portions of the reaction mixture were removed and diluted with toluene (3 ml) and any insoluble materials were removed using a centrifuge. The resulting clear solutions were analysed by PL emission spectroscopy and showed a change in the maximum emission wavelength from 450-850 nm over the course of the reaction, as shown in FIG. 7. (The lefthand-most emission spectrum in FIG. 7 was obtained for a sample of the reaction mixture removed a few minutes after the start of the reaction, and the righthand-most emission spectrum was obtained for a sample of the reaction mixture removed approximately 60 minutes after the start of the reaction. The emission spectra between the lefthand-most emission spectrum and the righthand-most emission spectrum were obtained for samples of the reaction mixture removed at intermediate times.) The peak in the emission spectrum has a full width at half the maximum intensity of the order of 100 nm.

When samples from such a reaction are illuminated with a UV light sources, the resultant emission is easily visible with the naked eye for early stage samples emitting in the visible region. This illustrates the high quantum yield of ZnN nanostructures obtainable by the present invention.

The corresponding emission spectra of these samples are shown in FIG. 7. The emission spectra of samples removed at times up to about one hour span from ultraviolet through the whole visible region and extend into the infra-red. Thus, nanocrystals having particular optical properties (such as a desired peak emission wavelength) can be obtained by appropriate choice of the reaction period before the nanocrystals are recovered from the solution.

The photoluminescence quantum yield of a sample removed from this reaction was measured and gave a value of 25%.

It can therefore be seen that the present invention makes possible the formation of zinc nitride nanocrystals, in particular nanocrystals of the Group II-N compound semiconductor family, which have extremely good light-emissive and crystalline properties.

Example 6

Colloidal ZnInGaN Core with ZnGaN Shell Semiconductor Nanocrystals

Gallium iodide (113 mg, 0.25 mmol), indium iodide (124 mg, 0.25 mmol), sodium amide (390 mg, 10 mmol), hexadecane thiol (153 µl, 0.5 mmol), zinc stearate (316 mg, 0.5 mmol) and 1-octadecene (40 ml) were heated rapidly to 225° C. After 20 minutes the mixture was cooled to room temperature and centrifuged to remove any insoluble material. This mixture consisted of the core only ZnInGaN nanoparticles. To form the ZnGaN shell around the nanoparticle core, 20 ml of the core solution was further treated with gallium iodide (113 mg, 0.25 mmol), zinc stearate (316 mg) and sodium amide (185 mg, 5 mmol) and heated to 225° C. for 20 minutes.

When samples from such a reaction are illuminated with a UV light sources, the resultant emission is easily visible with the naked eye for samples emitting in the visible region. This illustrates the high quantum yield of ZnInGaN—ZnGaN nanostructures (that is, nanostructures with a ZnInGaN core and a ZnGaN shell) obtainable by the present invention. The photoluminescence quantum yield of a sample removed from this reaction was measured and gave a value of 30%.

Example 7

Colloidal ZnInGaN Core with ZnS Shell Semiconductor Nanocrystals

Gallium iodide (113 mg, 0.25 mmol), indium iodide (124 mg, 0.25 mmol), sodium amide (390 mg, 10 mmol), hexadecane thiol (153 µl, 0.5 mmol), zinc stearate (316 mg, 0.5 mmol) and 1-octadecene (40 ml) were heated rapidly to 225° C. After 20 minutes the mixture was cooled to room temperature and centrifuged to remove any insoluble material. This mixture consisted of the core only ZnInGaN nanoparticles. To form the ZnS shell around the nanoparticle core the highly coloured solution was decanted from the solids and a 4 ml sample was treated with zinc diethyldithiocarbamate (100 mg, 0.27 mmol) for 40 minutes at 175° C.

When samples from such a reaction are illuminated with a UV light sources, the resultant emission is easily visible with the naked eye for samples emitting in the visible region. This illustrates the high quantum yield of ZnInGaN—ZnS nanostructures (that is, nanostructures with a ZnInGaN core and a ZnS shell) obtainable by the present invention. The photoluminescence quantum yield of a sample removed from this reaction was measured and gave a value of 23%.

Example 8

Colloidal ZnInGaN Core with Double Shell of ZnGaN and ZnS Semiconductor Nanocrystals Gallium iodide (113 mg, 0.25 mmol), indium iodide (124 mg, 0.25 mmol), sodium amide (390 mg, 10 mmol), hexadecane thiol (153 µl, 0.5 mmol), zinc stearate (316 mg, 0.5 mmol) and 1-octadecene (40 ml) were heated rapidly to 225° C. After 20 minutes the mixture was cooled to room temperature and centrifuged to remove any insoluble material. This mixture consisted of the core only ZnInGaN nanoparticles. To form the ZnGaN inner shell around the nanoparticle core, 20 ml of the resulting solution was further treated with gallium iodide (113 mg, 0.25 mmol) and sodium amide (185 mg, 5 mmol) and heated to 225° C. for 20 minutes. The resulting solution was centrifuged to remove any insoluble material and then treated with zinc diethyldithiocarbamate (500 mg, 1.35 mmol) and heated to 175° C. for a period of 60 minutes to form the ZnS outer shell.

When samples from such a reaction are illuminated with a UV light sources, the resultant emission is easily visible with the naked eye for samples emitting in the visible region. This illustrates the high quantum yield of ZnInGaN—ZnGaN—ZnS nanostructures (that is, nanostructures with a ZnInGaN core and a double shell of ZnGaN and ZnS) obtainable by the present invention. The photoluminescence quantum yield of a sample removed from this reaction was measured and gave a value of 22%.

In Examples 6 to 8 the core, and optionally the shell, of the core-shell nanoparticles of these examples are made of a II-III-N or II-N material. In a further application of the invention, the invention may be used to provide a shell of a II-III-N or II-N material in a core-shell nanoparticle in which the core is not composed of a II-III-N or II-N material.

The invention claimed is:

1. A method of making a semiconductor nanoparticle, the method comprising:
reacting together in a solvent at least one source of zinc, at least one source of a group III element, and at least one source of nitrogen,
wherein the resulting semiconductor nanoparticle is composed of a compound having the formula Zn-III-N, where III denotes one or more elements in Group III of the periodic table.

2. A method as claimed in claim 1 wherein the at least one source of nitrogen comprises an amide.

3. A method as claimed in claim 1, wherein the resulting semiconductor nanoparticle is composed of a compound having the formula ZnGaN.

4. A method as claimed in claim 1, wherein the resulting semiconductor nanoparticle is composed of a compound having the formula ZnInN.

5. A method as claimed in claim 1, wherein the resulting semiconductor nanoparticle is composed of a compound having the formula ZnAlN.

6. A method as claimed in claim 1, wherein the resulting semiconductor nanoparticle is composed of a compound having the formula ZnGaInN.

7. A method as claimed in claim 1, wherein the resulting semiconductor nanoparticle is light emissive.

8. A method as claimed in claim 1, wherein the resulting semiconductor nanoparticle has a photoluminescence quantum yield of at least 5%.

9. A method as claimed in claim 1, wherein the resulting semiconductor nanoparticle has a photoluminescence quantum yield of at least 20%.

10. A method as claimed in claim 1, wherein the resulting semiconductor nanoparticle has a photoluminescence quantum yield of at least 50%.

11. A method of making a semiconductor nanoparticle, the method comprising:

reacting together in a solvent at least one source of zinc, at least one source of a group III element, and at least one source of nitrogen, wherein the at least one source of zinc comprises a carboxylate of zinc.

12. A method as claimed in claim 11 wherein the at least one source of zinc comprises zinc stearate.

* * * * *